United States Patent [19]
Lin et al.

[11] Patent Number: 6,123,865
[45] Date of Patent: Sep. 26, 2000

[54] METHOD FOR IMPROVING ETCH UNIFORMITY DURING A WET ETCHING PROCESS

[75] Inventors: Wei-Chih Lin, Taoyuan Hsien; Ming-Sheng Kao, Tainan; Ming-Li Kung, Keelung; Chih-Ming Lin, Chiai, all of Taiwan

[73] Assignees: ProMOS Technologies, Inc.; Mosel Vitelic, Inc., both of Taiwan; Siemens AG, Munich, Germany

[21] Appl. No.: 09/206,642

[22] Filed: Dec. 7, 1998

[30] Foreign Application Priority Data

Sep. 9, 1998 [TW] Taiwan .................. 87115022

[51] Int. Cl.$^7$ ................................. H01L 21/302
[52] U.S. Cl. ..................... 216/91; 216/99; 216/101; 216/104; 216/107; 216/109; 134/1.3
[58] Field of Search ................ 134/1.3; 216/91, 216/99, 101, 104, 107, 109

[56] References Cited

U.S. PATENT DOCUMENTS

| | | |
|---|---|---|
| 3,630,804 | 12/1971 | Coffman et al. ............ 156/345 |
| 5,007,981 | 4/1991 | Kawasaki et al. .......... 156/643 |
| 5,078,832 | 1/1992 | Tanaka ........................ 156/639 |
| 5,135,608 | 8/1992 | Okutani ....................... 156/643 |
| 5,181,985 | 1/1993 | Lampert et al. ............ 156/635 |
| 5,275,695 | 1/1994 | Chang et al. ............. 156/666.1 |
| 5,279,704 | 1/1994 | Saito ........................... 156/640 |
| 5,487,398 | 1/1996 | Ohmi et al. ................ 134/95.1 |
| 5,488,964 | 2/1996 | Murakami et al. ........ 134/95.3 |
| 5,620,611 | 4/1997 | Datta et al. ................... 216/13 |

FOREIGN PATENT DOCUMENTS

| | | |
|---|---|---|
| 62-150350 | 7/1987 | Japan . |
| 63-237527 | 10/1988 | Japan . |
| 7-142438 | 6/1995 | Japan . |
| 10-071375 | 3/1998 | Japan . |

*Primary Examiner*—William Powell
*Assistant Examiner*—George Goudreau
*Attorney, Agent, or Firm*—Carr & Ferrell LLP

[57] ABSTRACT

A method for improving etch uniformity during a wet etching process is disclosed. The method comprises the steps of first rinsing the wafer to form a water film over the wafer surface, followed by liquid phase etching. The water film helps the subsequent viscous etchant to be spread across the wafer surface more uniformly to thereby improve the etch uniformity.

16 Claims, 1 Drawing Sheet

METHOD FOR IMPROVING ETCH UNIFORMITY DURING A WET ETCHING PROCESS

BACKGROUND OF THE INVENTION

1. Field of the Invention

The present invention relates to a method for etching films on semiconductor wafers for integrated circuits. More particularly, it relates to a method for improving etch uniformity during a wet etching process.

2. Description of the Related Arts

Integrated circuit fabrication processes that use reactive plasmas are commonplace in today's semiconductor production lines because of their potential for very high-accuracy transfer of resist patterns, i.e., anisotropic etching. By contrast, wet chemical etching results in isotropic etching, where both vertical and lateral etch rates are comparable. Nevertheless, wet etching is still the practical alternative for a high-throughput, flexible production process. With properly selected chemicals, etch reactions with the primary film are thermodynamically favored over reactions with the other films. The etch-rate ratio usually approaches infinity. Wet etches are especially suitable for blanket etches of polysilicon, oxide, nitride, and metal. Recently, there has been a resurgence of wet etching for certain process steps because plasma etching fails to provide the required etch selectivity, damage-free interface, and particle-contamination-free wafers. Using robotic handling and ultra-pure chemicals has improved particle control and process consistency. These improvements have revived wet etching processes for VLSI processing.

Two basic wet etching techniques are immersion etching and spray etching. Immersion etching is the simplest technique. The masked or unmasked wafer is submerged in the etch solution, and mechanical agitation is usually required to ensure etch uniformity and a consistent etch rate. Spray etching offers several advantages over immersion etching. Spray etching requires less volume of chemicals and is faster than immersion etching. Good process control and etch uniformity are easily obtained from spray etching because fresh etchant is constantly supplied to the wafer surface while the etch products are continuously removed. Single wafer spinning-chuck spray systems offer considerable process uniformity advantages.

FIG. 1 is a fragmentary sectional view of a spin etching device. As shown in FIG. 1, a semiconductor wafer 10 is horizontally placed on and fixed to a turntable 20 of a spin etching device. While the semiconductor wafer 10 is rotating, an etching solution 40 is supplied from a nozzle 30 disposed above the semiconductor wafer 10, dropping onto a substantially central area of the semiconductor wafer. The semiconductor wafer 10 is etched by the etching solution 40 as it is uniformly scattered over the semiconductor wafer under centrifugal forces.

The spin etching system as illustrated in FIG. 1 offers considerable process uniformity advantages. However, spin etching using viscous etchants such as sulfuric acid and phosphoric acid have generally failed to provide a uniform etch because the viscous etchants cannot spread uniformly across the wafer surface. The result is an incomplete etch or an undercutting of the surface layer, reducing the chip yield. The etch uniformity across the wafer becomes very important as film thickness is reduced, device dimensions shrink and wafer size increases. Therefore, an improved wet etching process that ensures a uniform etch is highly desirable.

SUMMARY OF THE INVENTION

In view of the above mentioned shortcoming, it is therefore an object of the invention to provide a method for improving etch uniformity during a wet etching process.

It is another object of the invention to provide a wet etching process for spin-etching semiconductor wafers which ensures a uniform etch across the wafer surface even when using viscous etchants.

According to the invention, there is provided a method for improving etch uniformity during a wet etching process, characterized by forming a water film over the wafer surface prior to etching the surface layer with a viscous acid solution. The water film helps the subsequent viscous etchant to be spread across the wafer surface more uniformly to thereby improve the etch uniformity.

The wet etching process of the invention comprises the steps of: (a) rotating a semiconductor wafer having a layer formed thereon at a first speed; (b) supplying de-ionized water (DI water) to the wafer to form a water film over the wafer surface; and (c) supplying an acid solution to the wafer for etching the layer before the water film is dried.

According to the process of the invention, in step (b) the wafer is preferably rotated at a relatively low speed to prevent the dispensed water from splashing, destroying film uniformity. The de-ionized water is supplied at a flow rate of about 0.2–1 l/min for about 1–6 seconds. After the de-ionized water has been supplied, it is more preferable that the wafer is rotated at a higher speed for a time, e.g., 2 seconds, to expel excess water off the wafer and thin the remaining water into a uniform film. If the excess water is not removed, a great deal of heat capable of damaging semiconductor devices is created upon the supply of acid solutions.

This etching process is particularly advantageous when a viscous etchant, such as a sulfuric acid based etchant, is employed. Etching solutions suitable for use in this invention include the solutions of sulfuric acid, hydrofluoric acid, nitric acid, phosphoric acid, and acetic acid, or a mixture thereof. The layer formed over the wafer being etched can be a metal layer formed of copper or aluminum, or a nonmetal layer formed of silicon, silicon oxide, borophosphosilicate glass (BPSG), phosphosilicate glass (PSG), borosilicate glass (BSG), silicon nitride, silicon oxynitride, or spin-on glass.

Figure 1:
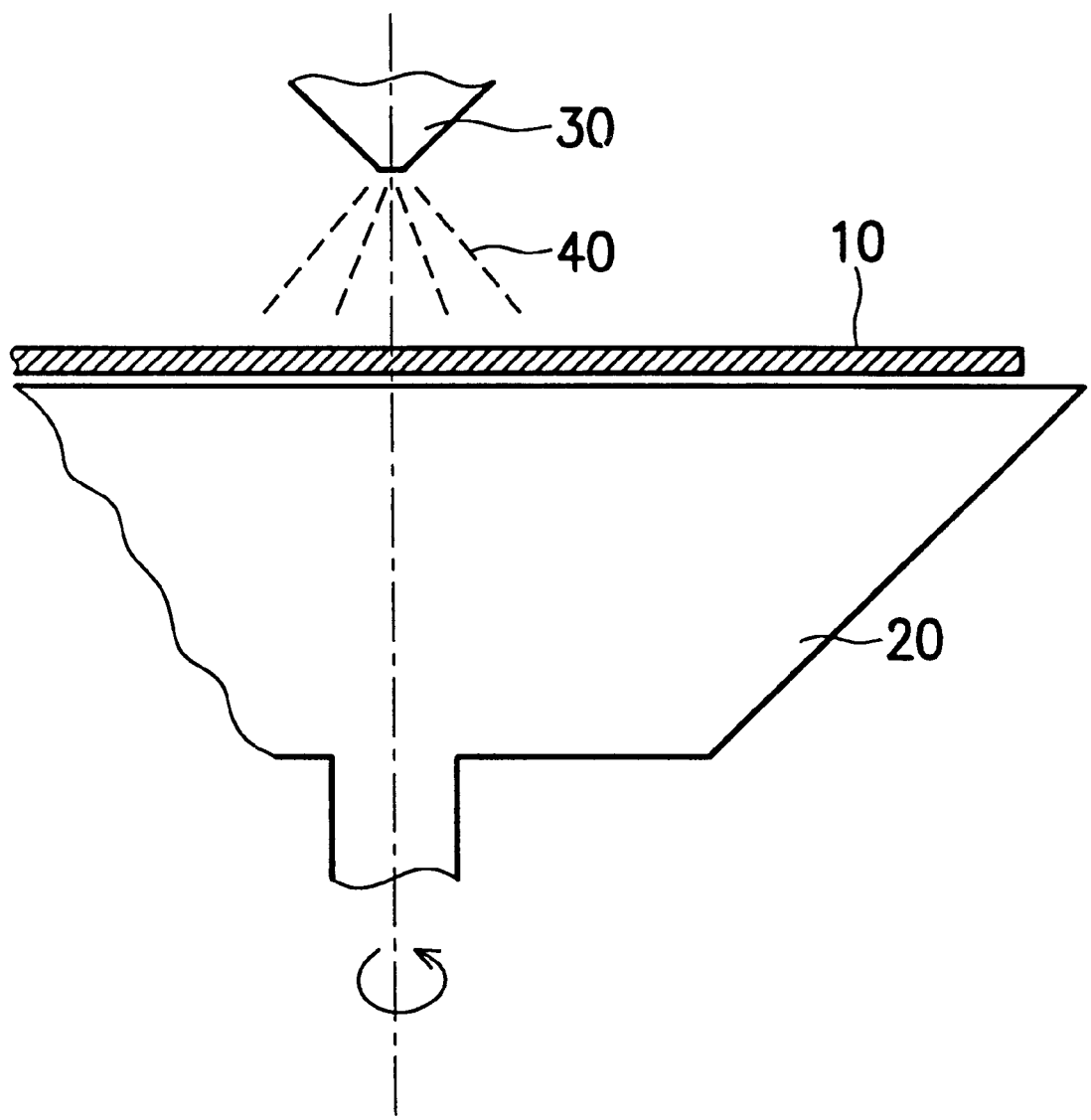
FIG. 1 is a fragmentary sectional view of a spin etching device.

Without intending to limit it in any manner, the present invention will be further illustrated by the following examples.

COMPARATIVE EXAMPLE

In this comparative example, a BSG layer of 5,000 Å thickness was stripped off from the underlying silicon nitride layer (2000–2200 Å) by a conventional wet etching process. This wet etching was carried out by a spin etching machine, SPIN ETCHER WET MASTER 201 (made by Semiconductor-Equiment Zubehoer A Co.,). An etching solution of sulfuric acid and hydrofluoric acid (10:1 v/v) was employed for a selective etch. The etch recipe and processing conditions are listed in Table 1 below:

TABLE 1

| 1. BSG etch | Chemistry:$H_2SO_4$/HF (20:1–3:1) |
| --- | --- |
| | Temperature: 20–60° C. |
| | Time: 70–180 sec |
| | Rotational speed: 1000 rpm |

TABLE 1-continued

| | |
|---|---|
| 2. $N_2$ purge | Chemistry: $N_2$ |
| | Time: 5 sec |
| | Rotational speed: 2000 rpm |
| 3. DI clean | Chemistry : DI water |
| | Time: 15 sec |
| | Rotational speed: 800 rpm |
| 4. $N_2$ dry | Chemistry $N_2$ |
| | Time: 15 sec |
| | Rotational speed: 2000 rpm |

EXAMPLE

In this example, the same BSG layer as in the comparative example was stripped off in accordance with the process of the invention using SPIN ETCHER WET MASTER 201. The wafer was first rinsed by DI water at a relatively low speed of 700 rpm. This pre-rinse was conducted for 2 seconds during which the flow rate of DI water was controlled at about 0.2–1 l/min. After this time, the wafer was rotated for another 2 seconds while the rotational speed was increased from 700 rpm to 1200 rpm to thereby expel excess water off the wafer and thin the remaining water into a uniform film. Subsequently, an etching solution of sulfuric acid and hydrofluoric acid (7:1 v/v) was supplied to the wafer surface for performing the BSG etch while the rotation was maintained at the same speed. The etch recipe and processing conditions are listed in Table 2 below:

TABLE 2

| | |
|---|---|
| 1. DI rinse | Chemistry: DI water |
| | Time: 2 sec |
| | Rotational speed: 700 rpm |
| 2. Stable | Chemistry: none |
| | Time: 2 sec |
| | Rotational speed: 1200 rpm |
| 3. BSG etch | Chemistry: $H_2SO_4$/HF (20:1–3:1) |
| | TEMPERATURE: 20–60° C. |
| | Time: 30–80 sec |
| | Rotational speed: 1200 rpm |
| 4. Npurge | Chemistry: $N_2$ |
| | Time: 5 sec |
| | Rotational speed: 2000 rpm |
| 5. DI clean | Chemistry: DI water |
| | Time: 15 sec |
| | Rotational speed: 800 rpm |
| 6. Stable | Chemistry: none |
| | Time: 5 sec |
| | Rotational speed: 2500 rpm |
| 7. $N_2$ dry | Chemistry: $N_2$ |
| | Time: 10 sec |
| | Rotational speed: 2000 rpm |

Table 3 below shows the results of the etch rate and etch uniformity measured in the above Comparative Example and Example.

TABLE 3

| COMPARATIVE EXAMPLE | | EXAMPLE | |
|---|---|---|---|
| Etch rate (Å/min) | Standard deviation of uniformity (Std U%) | Etch rate (Å/min) | Standard deviation of uniformity (Std U%) |
| 25296 | 17.3 | 20112 | 12.7 |
| 23092 | 21.2 | 18832 | 10.2 |

As can be seen from Table 3, the etch uniformity was improved by 5–10% compared to the conventional process by adding a pre-rinse step which took only 2 sec. The results in Table 3 also shows that the water film had little effect upon etch rate. Thus, this invention provides a simple but very practical way to improve etch uniformity in a wet etching process without significantly influencing the throughput.

While the invention has been particularly shown and described with the reference to the preferred embodiment thereof, it will be understood by those skilled in the art that various changes in form and details may be made without departing from the spirit and scope of the invention.

What is claimed is:

1. A method for improving etch uniformity during a wet etching process, comprising the steps of:
    providing a semiconductor wafer having a layer formed thereon; and
    forming a water film over the wafer surface prior to etching said layer with a viscous acid solution comprising sulfuric acid and an etchant selected from the group consisting of hydrofluoric acid, nitric acid, phosphoric acid, acetic acid, and mixtures thereof.
2. The method as claimed in claim 1, wherein said layer is a metal layer.
3. The method as claimed in claim 2, wherein said layer is a copper layer or aluminum layer.
4. The method as claimed in claim 1, wherein said layer is a nonmetal layer.
5. The method as claimed in claim 4, wherein said layer is formed of a material selected from the group consisting of: silicon, silicon oxide, borophosphosilicate glass (BPSG), phosphosilicate glass (PSG), borosilicate glass (BSG), silicon nitride, silicon oxynitride, and spin-on glass.
6. The method as claimed in claim 1, wherein said deposited film is a borosilicate glass layer and said acid solution is a solution of sulfuric acid and hydrofluoric acid.
7. A wet etching process, comprising the steps of:
    (a) rotating a semiconductor wafer having a layer formed thereon at a first speed;
    (b) supplying de-ionized water to said wafer to form a water film over the wafer surface; and
    (c) supplying an acid solution to said wafer for etching said layer before the water film is dried, while rotating said wafer at a second speed greater than said first speed.
8. The process as claimed in claim 7, further comprising a step of rotating said wafer at a third speed greater than said first speed for a time after supplying the de-ionized water.
9. The process as claimed in claim 7, wherein said de-ionized water is supplied at a flow rate of about 0.2–1 l/min.
10. The process as claimed in claim 9, wherein step (b) is carried out for about 1–6 seconds.
11. The process as claimed in claim 7, wherein said layer is a metal layer.
12. The process as claimed in claim 11, wherein said layer is a copper layer or aluminum layer.
13. The process as claimed in claim 7, wherein said layer is a nonmetal layer.
14. The process as claimed in claim 13, wherein said layer is formed of a material selected from the group consisting of: silicon, silicon oxide, borophosphosilicate glass (BPSG), phosphosilicate glass (PSG), borosilicate glass (BSG), silicon nitride, silicon oxynitride, and spin-on glass.
15. The process as claimed in claim 7, wherein said acid solution is selected from the group consisting of sulfuric acid solutions, hydrofluoric acid solutions, nitric acid solutions, phosphoric acid solutions, acetic acid solutions, and mixtures thereof.
16. The process as claimed in claim 7, wherein said layer is a borosilicate glass layer and said acid solution is a solution of sulfuric acid and hydrofluoric acid.

* * * * *